United States Patent
Liu et al.

(10) Patent No.: US 8,937,302 B2
(45) Date of Patent: Jan. 20, 2015

(54) ORGANIC LIGHT-EMITTING DIODE

(75) Inventors: Yawei Liu, Shenzhen (CN); Yuanchun Wu, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 42 days.

(21) Appl. No.: 13/699,727

(22) PCT Filed: Sep. 7, 2012

(86) PCT No.: PCT/CN2012/081104
§ 371 (c)(1),
(2), (4) Date: Nov. 24, 2012

(87) PCT Pub. No.: WO2014/023054
PCT Pub. Date: Feb. 13, 2014

(65) Prior Publication Data
US 2014/0034912 A1 Feb. 6, 2014

(30) Foreign Application Priority Data
Aug. 6, 2012 (CN) .......................... 2012 1 0284420

(51) Int. Cl.
*H01L 29/08* (2006.01)
*H01L 51/50* (2006.01)
(52) U.S. Cl.
CPC .................... *H01L 51/5036* (2013.01)
USPC ............. 257/40; 257/E21.521; 257/E21.328; 438/14; 345/690

(58) Field of Classification Search
USPC ............... 257/40, E21.521, E21.328; 438/14; 345/690
See application file for complete search history.

(56) References Cited

U.S. PATENT DOCUMENTS

| | | | |
|---|---|---|---|
| 6,570,584 B1 * | 5/2003 | Cok et al. | 345/690 |
| 2006/0149132 A1 * | 7/2006 | Iddan | 600/160 |
| 2011/0031876 A1 * | 2/2011 | Park et al. | 313/504 |
| 2011/0147773 A1 * | 6/2011 | Kostka | 257/98 |

FOREIGN PATENT DOCUMENTS

| | | |
|---|---|---|
| CN | 1674736 A | 9/2005 |
| CN | 102760837 A | 10/2012 |

* cited by examiner

*Primary Examiner* — Thao X. Le
*Assistant Examiner* — Matthew Gordon
(74) *Attorney, Agent, or Firm* — Cheng-Ju Chiang

(57) ABSTRACT

The present invention provides an organic light-emitting diode, which includes a light-transmitting substrate, an anode arranged on the light-transmitting substrate, a hole transporting layer arranged on the anode, a light emission layer arranged on the hole transporting layer, an electron transporting layer arranged on the light emission layer, and a cathode arranged on the electron transporting layer. The light emission layer includes a color light emission layer and an ultraviolet light emission layer spaced from the color light emission layer. The present invention integrates functions of color displaying and ultraviolet source together to allow the color displaying and the ultraviolet source to be simultaneously or individually activated.

8 Claims, 3 Drawing Sheets

ORGANIC LIGHT-EMITTING DIODE

BACKGROUND OF THE INVENTION

1. Field of the Invention

The present invention relates to the field of displaying and illumination, and in particular to an organic light-emitting diode (OLED).

2. The Related Arts

Ultraviolet light has a wide and prosperous application in industry and agricultural sectors and daily living. Since 1935 when the first high pressure mercury lamp was made available, ultraviolet has attracted significant attention of people. Before the fifties of the twentieth century, mercury lamps were the only available artificial ultraviolet source, but no practical use has been made. The advent of quartz glass, the maturity of packaging techniques, the development of electrical vacuum industry, and the improvement of ultraviolet spectrum techniques together bring about the stage of true and valuable application of ultraviolet. Besides the mercury lamps of the early days, various new ultraviolet sources were developed one after another in the end of the fifties of the twentieth century. They could be classified as mercury arc lamps, metal halide lamps, electrodeless lamps, xenon lamps, excimer ultraviolet lamps, and ultraviolet light-emitting diodes. Among the ultraviolet sources, the most commonly used one today is gaseous ultraviolet sources, but it has various deficiencies, including the primary ingredient showing serious toxicity, causing secondary pollution, component made therewith being hard to use, and being easily broken. In comparison with it, a newly developed ultraviolet organic light-emitting diode (UV-OLED) shows various advantages in respect of environmental conservation, low cost, being easy to make in large area, and being easy to integrate with flexible substrate and is considered potential replenishment for today's insufficiency of availability of ultraviolet sources.

Organic light-emitting diode (OLED) is considered the next-generation displaying technology and has various advantages, including active illumination, being compact and light-weighted, and power saving and is now available for small-sized panels that are used in electronic devices, such as mobile phone and MP3.

Heretofore, no OLED is available for functioning as both a color display and an ultraviolet source.

SUMMARY OF THE INVENTION

An object of the present invention is to provide an organic light-emitting diode (OLED), which comprises a color display zone and an ultraviolet zone, wherein the color display zone and the ultraviolet zone can be lit individually or at the same time.

To achieve the object, the present invention provides an organic light-emitting diode, which comprises: a light-transmitting substrate, an anode arranged on the light-transmitting substrate, a hole transporting layer arranged on the anode, a light emission layer arranged on the hole transporting layer, an electron transporting layer arranged on the light emission layer, and a cathode arranged on the electron transporting layer. The light emission layer comprises a color light emission layer and an ultraviolet light emission layer spaced from the color light emission layer.

The color light emission layer comprises a plurality of color pixel units regularly distributed thereon. Each of the color pixel units comprises three sub-pixel points of red, green, and blue colors. The three sub-pixel points of red, green, and blue colors are driven by a TFT circuit.

The ultraviolet light emission layer is electrically connected to the anode and the cathode.

The ultraviolet light emission layer comprises a plurality of ultraviolet pixel units regularly distributed thereon. Each of the ultraviolet pixel units comprises three identical ultraviolet sub-pixel points.

The ultraviolet light emission layer is made of a material of carbazole-contained organic compounds, fluorene-contained organic compounds, triphenylamine-contained organic compounds, or pentacene-contained organic compounds.

The light-transmitting substrate comprises a quartz glass plate or a polymethylmethacrylate board.

The anode comprises an indium tin oxides layer formed on the light-transmitting substrate.

The hole transporting layer comprises a layer of N,N'-di(3-methylphenyl)-N,N'-biphenyl-1,1'-biphenyl-4,4'-diamine or N,N'-di(1-naphthyl)-N,N'-biphenyl-1,1'-biphenyl-4,4'-diamine.

The hole blocking layer comprises a layer of 1,3,5-(benzenetriyl)tris(1-phenyl-1H-benzimidazole) or 2,9-dimethyl-4,7-diphenyl-1,10-phenanthroline.

The electron transporting layer comprises a layer of doped 8-hydroxyquinoline aluminum and the cathode comprises a layer of aluminum or silver.

The present invention also provides an organic light-emitting diode, which comprises: a light-transmitting substrate, an anode arranged on the light-transmitting substrate, a hole transporting layer arranged on the anode, a light emission layer arranged on the hole transporting layer, an electron transporting layer arranged on the light emission layer, and a cathode arranged on the electron transporting layer, the light emission layer comprising a color light emission layer and an ultraviolet light emission layer spaced from the color light emission layer;

wherein the color light emission layer comprises a plurality of color pixel units regularly distributed thereon, each of the color pixel units comprising three sub-pixel points of red, green, and blue colors, the thee sub-pixel points of red, green, and blue colors being driven by a TFT circuit;

wherein the ultraviolet light emission layer is electrically connected to the anode and the cathode;

wherein the ultraviolet light emission layer comprises a plurality of ultraviolet pixel units regularly distributed thereon, each of the ultraviolet pixel units comprising three identical ultraviolet sub-pixel points;

wherein the ultraviolet light emission layer is made of a material of carbazole-contained organic compounds, fluorene-contained organic compounds, triphenylamine-contained organic compounds, or pentacene-contained organic compounds;

wherein the light-transmitting substrate comprises a quartz glass plate or a polymethylmethacrylate board;

wherein the anode comprises an indium tin oxides layer formed on the light-transmitting substrate;

wherein the hole transporting layer comprises a layer of N,N'-di(3-methylphenyl)-N,N'-biphenyl-1,1'-biphenyl-4,4'-diamine or N,N'-di(1-naphthyl)-N,N'-biphenyl-1,1'-biphenyl-4,4'-diamine;

wherein the hole blocking layer comprises a layer of 1,3,5-(benzenetriyl)tris(1-phenyl-1H-benzimidazole) or 2,9-dimethyl-4,7-diphenyl-1,10-phenanthroline; and wherein the electron transporting layer comprises a layer of doped 8-hydroxyquinoline aluminum and the cathode comprises a layer of aluminum or silver.

The efficacy of the present invention is that the present invention provides an organic light-emitting diode, which integrates functions of color displaying and ultraviolet source together to allow the color displaying and the ultraviolet source to be simultaneously or individually activated. The ultraviolet source is supplied from the organic light-emitting diode, which is an entirely solid light source and can effectively overcomes the deficiencies of the conventional gases ultraviolet sources, such as the primary ingredient (mercury) showing serious toxicity, secondary pollution, component made therewith being hard to use, and being easily broken. Further, the organic light-emitting diode is a planar light source, which can be made as a large area component and has a starting voltage of only 10V or so, whereby the component has a low power consumption and increased electricity-light power conversion efficiency, saves energy, and reduces cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
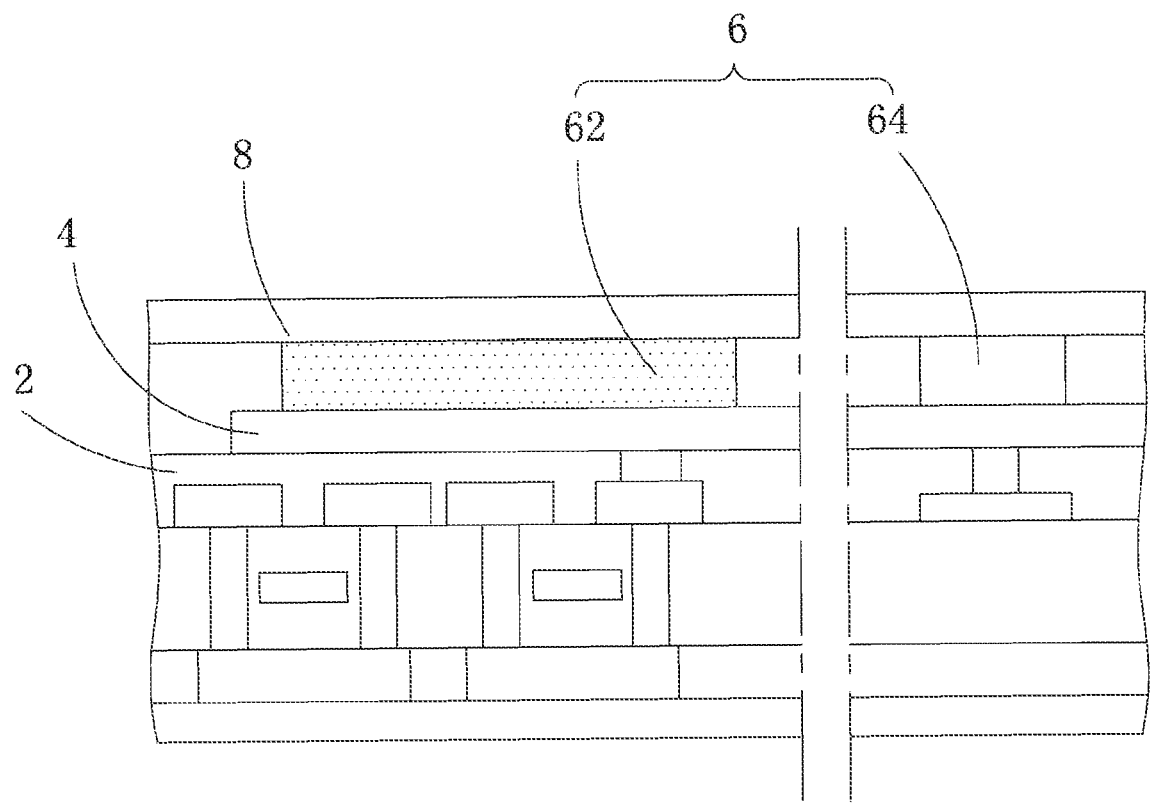
FIG. 1 is a schematic view showing the structure of an organic light-emitting diode (OLED) according to the present invention.
Figure 2:
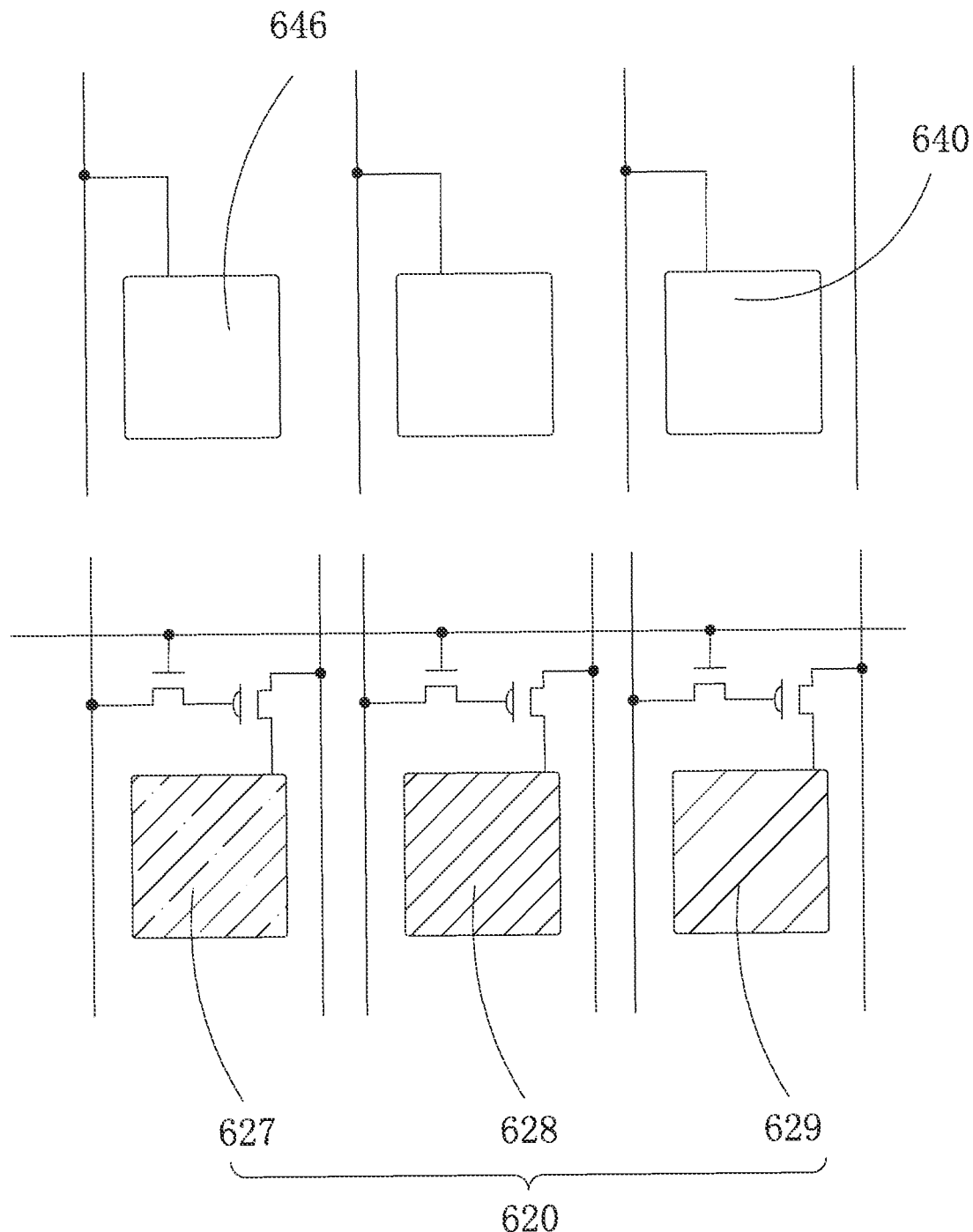
FIG. 2 is a schematic view showing a thin-film transistor (TFT) drive circuit of color luminous layer and a circuit of ultraviolet luminous layer of an OLED according to the present invention.
Figure 3:
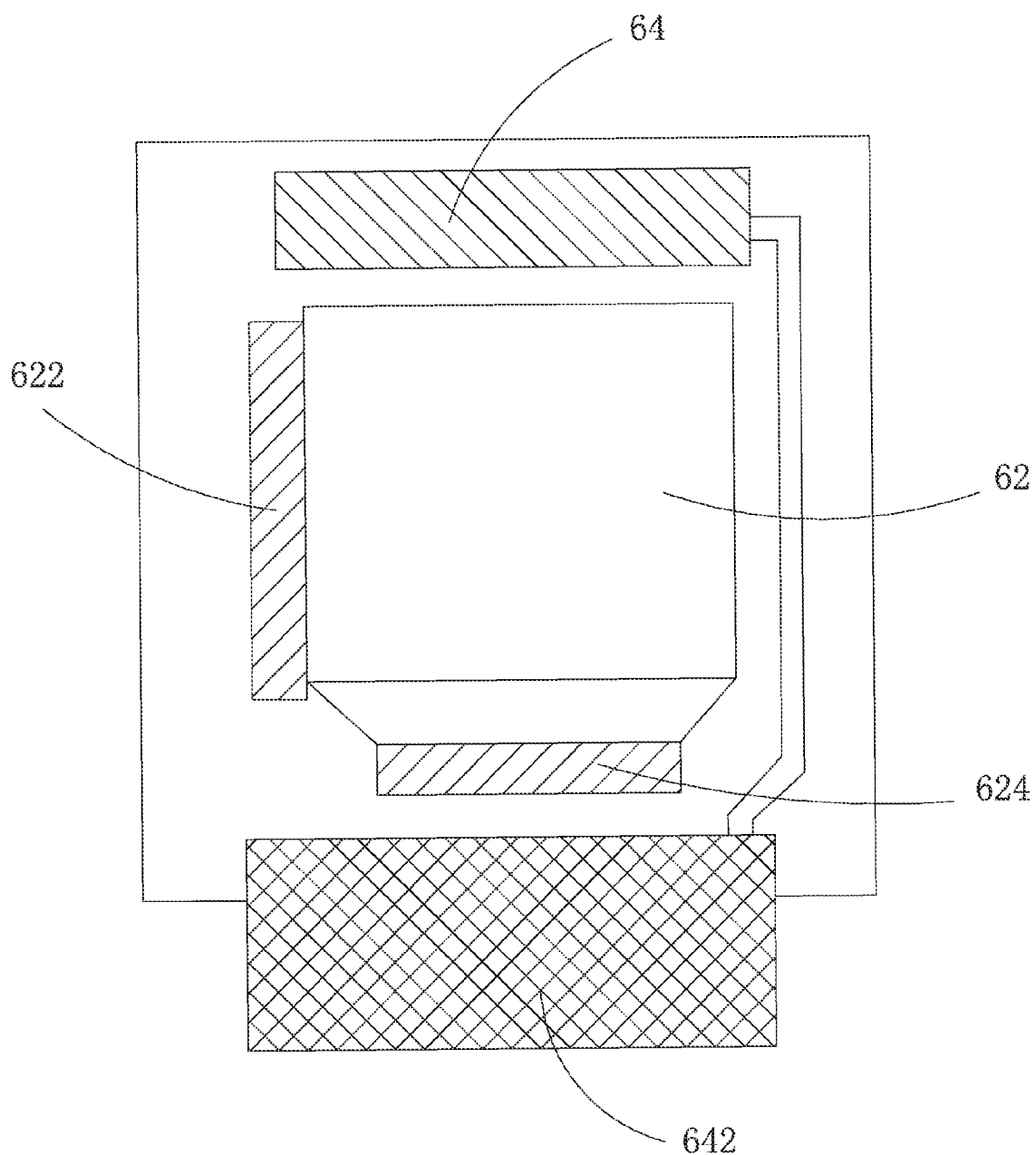
FIG. 3 is a schematic view illustrating the OLED according to the present invention.

Referring to FIGS. 1-3, the present invention provides an organic light-emitting diode (OLED), which comprises: a light-transmitting substrate 2, an anode 4 arranged on the light-transmitting substrate 2, a hole transporting layer (not shown) arranged on the anode 4, a light emission layer 6 arranged on the hole transporting layer, an electron transporting layer (not shown) arranged on the light emission layer 6, and a cathode 8 arranged on the electron transporting layer.

The light emission layer 6 comprises: a color light emission layer 62 and an ultraviolet light emission layer 64 spaced from the color light emission layer 62. The color light emission layer 62 is driven by a thin-film transistor (TFT) circuit. The TFT circuit comprises gate drive 622 and source drive 624 for realizing displaying of color mode. The ultraviolet light emission layer 64 is set in direct electrical connection with the anode and the cathode ad is directly driven by a flexible circuit board 642 to achieve a function of ultraviolet source. Thus, the function of color displaying and the function of ultraviolet source are integrated together and the color displaying function and the ultraviolet source function can be simultaneously activated or individually activated without undesired mutual interference.

The color light emission layer 62 comprises a plurality of color pixel units 620 regularly distributed thereon. Each of the color pixel units 620 comprises three sub-pixel points 627, 628, 629 respectively associated with red, green, and blue colors. The red, green, and blue sub-pixel points 627, 628, 629 are driven by the TFT circuit.

The ultraviolet light emission layer 64 comprises a plurality of ultraviolet pixel units 640 regularly distributed thereon. Each of the ultraviolet pixel units 640 comprises three identical ultraviolet sub-pixel points 646.

The ultraviolet light emission layer 64 is made of a material of carbazole-contained organic compound, fluorene-contained organic compound, triphenylamine-contained organic compound, or pentacene-contained organic compound.

The carbazole organic compound is of a formula as follows:

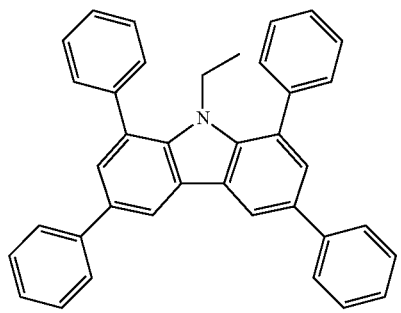 [SMILES: CCn1c2c(-c3ccccc3)cc(-c3ccccc3)cc2c2cc(-c3ccccc3)cc(-c3ccccc3)c21]

which has a band gap of 3.25 eV and a peak of emission spectrum that is around 394 nm.

The pentacene-contained organic compound is of a formula as follows:

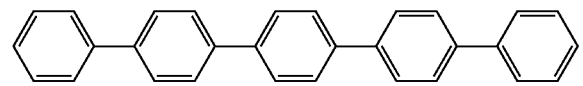 [SMILES: c1ccc(-c2ccc(-c3ccc(-c4ccc(-c5ccccc5)cc4)cc3)cc2)cc1]

which has a band gap of 3.48 eV and the peak of emission spectrum that is around 310 nm.

Preferably, the light-transmitting substrate 2 is a quartz glass plate or a polymethylmethacrylate board. The anode 4 is made of indium tin oxides (ITO), which is formed on the light-transmitting substrate 2 through sputtering. The hole transporting layer is a layer of N,N'-di(3-methylphenyl)-N, N'-biphenyl-1,1'-biphenyl-4,4'-diamine or N,N'-di(1-naphthyl)-N,N'-biphenyl-1,1'-biphenyl-4,4'-diamine. The hole blocking layer is a layer of 1,3,5-(benzenetriyl)tris(1-phenyl-1H-benzimidazole) or 2,9-dimethyl-4,7-diphenyl-1,10-phenanthroline. The electron transporting layer is a layer of doped 8-hydroxyquinoline aluminum. The cathode 8 comprises a layer of aluminum or silver.

The organic light-emitting diode according to the present invention can be of various uses, including:

(1) It can be used in a mobile phone in such a way that the organic light-emitting diode functions as a color display screen in normal operation and may activate the function of ultraviolet source in the inspection of counterfeit bank notes.

(2) The organic light-emitting diode is switchable from the color display mode to the ultraviolet mode to provide ultraviolet light for illumination.

(3) It can be used in household television set ins such a way that the organic light-emitting diode functions as a color display screen of the television in normal operation and the color display screen is switchable from the color display mode to the ultraviolet mode to allow the screen to emit ultraviolet light for various applications that rely on ultraviolet light, such as inspection of counterfeit bank notes and disinfection; or alternatively, both the color display mode and the ultraviolet modes are activated simultaneously.

In summary, the present invention provides an organic light-emitting diode, which integrates functions of color displaying and ultraviolet source together to allow the color displaying and the ultraviolet source to be simultaneously or individually activated. The ultraviolet source is supplied from the organic light-emitting diode, which is an entirely solid light source and can effectively overcomes the deficiencies of the conventional gases ultraviolet sources, such as the primary ingredient (mercury) showing serious toxicity, secondary pollution, component made therewith being hard to use, and being easily broken. Further, the organic light-emitting diode is a planar light source, which can be made as a large area component and has a starting voltage of only 10V or so, whereby the component has a low power consumption and increased electricity-light power conversion efficiency, saves energy, and reduces cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light-emitting diode, comprising: a light-transmitting substrate, an anode arranged on the light-transmitting substrate, a hole transporting layer arranged on the anode, a light emission layer arranged on the hole transporting layer, an electron transporting layer arranged on the light emission layer, and a cathode arranged on the electron transporting layer, the light emission layer comprising a color light emission layer and an ultraviolet light emission layer spaced from the color light emission layer; wherein a hole blocking layer comprises a layer of 1,3,5-(benzenetriyl)tris(1-phenyl-1H-benzimidazole) or 2,9-dimethyl-4,7-diphenyl-1,10-phenanthroline; wherein the color light emission layer comprises a plurality of color pixel units regularly distributed thereon, each of the color pixel units comprising three sub-pixel points of red, green, and blue colors, the three sub-pixel points of red, green, and blue colors being driven by a Thin Film Transistor (TFT) circuit; and wherein the ultraviolet light emission layer comprises a plurality of ultraviolet pixel units regularly distributed thereon, each of the ultraviolet pixel units comprising three identical ultraviolet sub-pixel points.

2. The organic light-emitting diode as claimed in claim 1, wherein the ultraviolet light emission layer is electrically connected to the anode and the cathode.

3. The organic light-emitting diode as claimed in claim 1, wherein the ultraviolet light emission layer is made of a material of carbazole-contained organic compounds, fluorene-contained organic compounds, triphenylamine-contained organic compounds, or pentacene-contained organic compounds.

4. The organic light-emitting diode as claimed in claim 1, wherein the light-transmitting substrate comprises a quartz glass plate or a polymethylmethacrylate board.

5. The organic light-emitting diode as claimed in claim 1, wherein the anode comprises an indium tin oxides layer formed on the light-transmitting substrate.

6. The organic light-emitting diode as claimed in claim 1, wherein the hole transporting layer comprises a layer of N,N'-di(3-methylphenyl)-N,N'-biphenyl-1,1'-biphenyl-4,4'-diamine or N,N'-di(1-naphthyl)-N,N'-biphenyl-1,1'-biphenyl-4,4'-diamine.

7. The organic light-emitting diode as claimed in claim 1, wherein the electron transporting layer comprises a layer of doped 8-hydroxyquinoline aluminum and the cathode comprises a layer of aluminum or silver.

8. An organic light-emitting diode, comprising: a light-transmitting substrate, an anode arranged on the light-transmitting substrate, a hole transporting layer arranged on the anode, a light emission layer arranged on the hole transporting layer, an electron transporting layer arranged on the light emission layer, and a cathode arranged on the electron transporting layer, the light emission layer comprising a color light emission layer and an ultraviolet light emission layer spaced from the color light emission layer;
    wherein the color light emission layer comprises a plurality of color pixel units regularly distributed thereon, each of the color pixel units comprising three sub-pixel points of red, green, and blue colors, the three sub-pixel points of red, green, and blue colors being driven by a Thin Film Transistor (TFT) circuit;
    wherein the ultraviolet light emission layer is electrically connected to the anode and the cathode;
    wherein the ultraviolet light emission layer comprises a plurality of ultraviolet pixel units regularly distributed thereon, each of the ultraviolet pixel units comprising three identical ultraviolet sub-pixel points;
    wherein the ultraviolet light emission layer is made of a material of carbazole-contained organic compounds, fluorene-contained organic compounds, triphenylamine-contained organic compounds, or pentacene-contained organic compounds;
    wherein the light-transmitting substrate comprises a quartz glass plate or a polymethylmethacrylate board;
    wherein the anode comprises an indium tin oxides layer formed on the light-transmitting substrate;
    wherein the hole transporting layer comprises a layer of N,N'-di(3-methylphenyl)-N,N'-biphenyl-1,1'-biphenyl-4,4'-diamine or N,N'-di(1-naphthyl)-N,N'-biphenyl-1,1'-biphenyl-4,4'-diamine;
    wherein a hole blocking layer comprises a layer of 1,3,5-(benzenetriyl)tris(1-phenyl-1H-benzimidazole) or 2,9-dimethyl-4,7-diphenyl-1,10-phenanthroline; and
    wherein the electron transporting layer comprises a layer of doped 8-hydroxyquinoline aluminum and the cathode comprises a layer of aluminum or silver.

* * * * *